(12) United States Patent
Thorp et al.

(10) Patent No.: US 9,202,539 B2
(45) Date of Patent: *Dec. 1, 2015

(54) METHODS AND APPARATUS FOR REDUCING PROGRAMMING TIME OF A MEMORY CELL

(71) Applicant: SanDisk 3D LLC, Milpitas, CA (US)

(72) Inventors: Tyler J. Thorp, San Francisco, CA (US); Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/290,888

(22) Filed: May 29, 2014

(65) Prior Publication Data

US 2014/0269129 A1    Sep. 18, 2014

Related U.S. Application Data

(63) Continuation of application No. 13/890,622, filed on May 9, 2013, now Pat. No. 8,773,898, which is a continuation of application No. 13/403,454, filed on Feb. 23, 2012, now Pat. No. 8,441,849, which is a continuation of application No. 12/551,548, filed on Aug. 31, 2009, now Pat. No. 8,125,822.

(51) Int. Cl.
*G11C 7/12* (2006.01)
*G11C 8/08* (2006.01)
(Continued)

(52) U.S. Cl.
CPC *G11C 7/12* (2013.01); *G11C 7/065* (2013.01); *G11C 8/08* (2013.01); *G11C 13/0004* (2013.01); *G11C 13/0023* (2013.01); *G11C 13/0061* (2013.01); *G11C 13/0069* (2013.01)

(58) Field of Classification Search
CPC ............ G11C 7/12; G11C 7/065; G11C 8/08; G11C 13/0004; G11C 13/0002; G11C 13/0023; G11C 13/0061; G11C 13/0069
USPC ............. 365/163, 148, 158, 175, 189.16, 207
See application file for complete search history.

(56) References Cited

U.S. PATENT DOCUMENTS 5,737,259 A    4/1998    Chang
5,982,659 A    11/1999   Irrinki et al.
(Continued)

FOREIGN PATENT DOCUMENTS

WO    WO 2008-013619    1/2008

OTHER PUBLICATIONS

Lee et al., "A 90nm 1.8V 512Mb Diode-Switch PRAM with 266MB/s Read Throughput", Feb. 14, 2007; 2007 IEEE International Solid-State Circuits Conference, Session 26/Non-Volatile Memories/26.1, pp. 472, 473 and 616.

(Continued)

*Primary Examiner* — Tan T. Nguyen
(74) *Attorney, Agent, or Firm* — Dugan & Dugan, PC

(57) ABSTRACT

A method is provided for programming a memory cell having a first terminal coupled to a word line and a second terminal coupled to a bit line. During a first predetermined time interval, the word line is switched from a first standby voltage to a first voltage, the bit line is switched from a second standby voltage to a predetermined voltage, and a voltage drop across the first and second terminals is a safe voltage that does not program the memory cell. During a second predetermined time interval, the word line is switched from the first voltage to a second voltage, and a voltage drop across the first and second terminals is a programming voltage that is sufficient to program the memory cell. Numerous other aspects are provided.

20 Claims, 4 Drawing Sheets

(51) Int. Cl.
*G11C 13/00* (2006.01)
*G11C 7/06* (2006.01)

(56) References Cited

U.S. PATENT DOCUMENTS

| | | | |
|---|---|---|---|
| 6,191,972 B1 | 2/2001 | Miura et al. | |
| 6,285,582 B1 | 9/2001 | Lin | |
| 6,545,898 B1 | 4/2003 | Scheuerlein | |
| 6,618,295 B2 | 9/2003 | Scheuerlein | |
| 6,625,054 B2 | 9/2003 | Lowrey et al. | |
| 6,747,893 B2 | 6/2004 | Uribe et al. | |
| 6,822,903 B2 | 11/2004 | Scheuerlein et al. | |
| 6,963,504 B2 | 11/2005 | Scheuerlein et al. | |
| 7,283,387 B2 | 10/2007 | Cho et al. | |
| 7,283,389 B2 | 10/2007 | Liao et al. | |
| 7,355,879 B2 * | 4/2008 | Hirai et al. | 365/148 |
| 7,420,833 B2 * | 9/2008 | Dan et al. | 365/145 |
| 7,440,315 B2 | 10/2008 | Lung | |
| 7,577,024 B2 | 8/2009 | Fackenthal et al. | |
| 7,813,167 B2 | 10/2010 | Porter | |
| 7,869,260 B2 | 1/2011 | Ueda | |
| 7,889,537 B2 | 2/2011 | Edahiro et al. | |
| 7,916,530 B2 | 3/2011 | Shepard | |
| 8,014,201 B2 | 9/2011 | Park | |
| 8,125,822 B2 * | 2/2012 | Thorp et al. | 365/163 |
| 8,441,849 B2 * | 5/2013 | Thorp et al. | 365/163 |
| 8,773,898 B2 * | 7/2014 | Thorp et al. | 365/163 |
| 2006/0050561 A1 * | 3/2006 | Guterman et al. | G11C 16/30 365/185.19 |
| 2006/0166455 A1 | 7/2006 | Gordon | |
| 2009/0052227 A1 | 2/2009 | Edahiro | |
| 2009/0207647 A1 | 8/2009 | Maejima | |
| 2011/0051504 A1 | 3/2011 | Thorp et al. | |
| 2011/0051505 A1 | 3/2011 | Thorp et al. | |
| 2011/0051506 A1 | 3/2011 | Thorp et al. | |
| 2012/0155163 A1 | 6/2012 | Thorp et al. | |
| 2013/0148421 A1 | 6/2013 | Thorp et al. | |
| 2013/0242681 A1 | 9/2013 | Thorp et al. | |

OTHER PUBLICATIONS

Hanzawa et al., "A 512kB Embedded Phase Change Memory with 416kB/s Write Throughput at 100μA Cell Write Current", 2007 IEEE International Solid-State Circuits Conference, Session 26/Non-Volatile Memories/26.2, pp. 474, 475 and 616.

Partial International Search of related International Application No. PCT/US2010/045684 Annex to invitation to pay additional fees dated Nov. 18, 2010.
Office Action of U.S. Appl. No. 12/551,548 mailed Jan. 6, 2011.
International Search Report and Written Opinion of related International Application No. PCT/US2010/045684 Jan. 31, 2011.
Apr. 5, 2011 Reply to Jan. 6, 2011 Office Action of related U.S. Appl. No. 12/551,548.
Notice of Allowance of U.S. Appl. No. 12/551,546 mailed Apr. 15, 2011.
Notice of Allowance of related U.S. Appl. No. 12/551,548 mailed May 23, 2011.
Notice of Allowance of U.S. Appl. No. 12/551,546 mailed Jun. 21, 2011.
Notice of Allowance of related U.S. Appl. No. 12/551,548 mailed Oct. 26, 2011.
Restriction Requirement of related U.S. Appl. No. 12/551,553 mailed Nov. 25, 2011.
Dec. 19, 2011 Reply to Nov. 25, 2011 Restriction Requirement of related U.S. Appl. No. 12/551,553.
Office Action of related U.S. Appl. No. 12/551,553 Jan. 20, 2012.
Apr. 20, 2012 Response to Jan. 20, 2012 Office Action of related U.S. Appl. No. 12/551,553.
Final Office Action of related U.S. Appl. No. 12/551,553 mailed May 17, 2012.
Aug. 16, 2012 RCE and Response to May 17, 2012 Final Office Action of related U.S. Appl. No. 12/551,553.
Office Action of related U.S. Appl. No. 13/403,454 mailed Sep. 21, 2012.
Notice of Allowance of related U.S. Appl. No. 12/551,553 mailed Oct. 12, 2012.
Dec. 19, 2012 Terminal Disclaimers and Response to Sep. 21, 2012 Office Action of related U.S. Appl. No. 13/403,454.
Notice of Allowance in related U.S. Appl. No. 13/403,454 mailed Jan. 23, 2013.
Notice of Allowance of related U.S. Appl. No. 13/765,394 mailed Jul. 10, 2013.
Office Action in related U.S. Appl. No. 13/890,622 dated Oct. 30, 2013.
Jan. 30, 2014 Response to Oct. 30, 2013 Office Action in related U.S. Appl. No. 13/890,622.
Notice of Allowance of related U.S. Appl. No. 13/890,622 mailed Feb. 26, 2014.

* cited by examiner

METHODS AND APPARATUS FOR REDUCING PROGRAMMING TIME OF A MEMORY CELL

REFERENCE TO RELATED APPLICATIONS

This application is a continuation of and claims priority to U.S. patent application Ser. No. 13/890,622, filed May 9, 2013, now U.S. Pat. No. 8,773,898, which is a continuation of and claims priority to U.S. patent application Ser. No. 13/403,454, filed Feb. 23, 2012, now U.S. Pat. No. 8,441,849, which is a continuation of and claims priority to U.S. patent application Ser. No. 12/551,548, filed Aug. 31, 2009, now U.S. Pat. No. 8,125,822, each of which is incorporated by reference herein in its entirety for all purposes.

The present application is related to the following patent applications, which are hereby incorporated by reference herein in their entirety for all purposes:

U.S. patent application Ser. No. 12/551,546, filed Aug. 31, 2009, now U.S. Pat. No. 8,040,721; and U.S. patent application Ser. No. 12/551,553, filed Aug. 31, 2009, and titled "FLEXIBLE MULTI-PULSE SET OPERATION FOR PHASE-CHANGE MEMORIES."

BACKGROUND

The present invention relates generally to integrated circuits containing memory arrays, and more particularly, to reducing the programming time of memory cells of such arrays.

Conventionally, memory performance is affected by the need to limit the amount of current used to program memory cells. If too much current is applied to a memory cell, the memory cell may be damaged. However, limiting the amount of current used to program the memory cell increases the amount of time needed to program the cell. Thus, what are needed are methods and apparatus for quickly programming memory cells without risking damage to the memory cells.

SUMMARY

In a first aspect of the invention, a method is provided for programming a memory cell having a first terminal coupled to a word line and a second terminal coupled to a bit line. During a first predetermined time interval, the word line is switched from a first standby voltage to a first voltage, the bit line is switched from a second standby voltage to a predetermined voltage, and a voltage drop across the first and second terminals is a safe voltage that does not program the memory cell. During a second predetermined time interval, the word line is switched from the first voltage to a second voltage, and a voltage drop across the first and second terminals is a programming voltage that is sufficient to program the memory cell.

In a second aspect of the invention, apparatus are provided for programming a memory cell having a first terminal coupled to a word line and a second terminal coupled to a bit line. The apparatus includes a control circuit coupled to the word line, and a sense amplifier coupled to the bit line. During a first predetermined time interval, the control circuit is adapted to switch the word line from a first standby voltage to a first voltage, the sense amplifier is adapted to charge the bit line from a second standby voltage to a predetermined voltage, and a voltage drop across the first and second terminals is a safe voltage that does not program the memory cell. During a second predetermined time interval, the control circuit is adapted to switch the word line from the first voltage to a second voltage, and a voltage drop across the first and second terminals is a programming voltage that is sufficient to program the memory cell.

In a third aspect of the invention, a memory array is provides that includes a memory cell having a first terminal coupled to a word line and a second terminal coupled to a bit line. The memory array includes a control circuit coupled to the word line, and a sense amplifier coupled to the bit line. During a first predetermined time interval, the control circuit is adapted to switch the word line from a first standby voltage to a first voltage, the sense amplifier is adapted to charge the bit line from a second standby voltage to a predetermined voltage, and a voltage drop across the first and second terminals is a safe voltage that does not program the memory cell. During a second predetermined time interval, the control circuit is adapted to switch the word line from the first voltage to a second voltage, and a voltage drop across the first and second terminals is a programming voltage that is sufficient to program the memory cell.

Other features and aspects of the present invention will become more fully apparent from the following detailed description, the appended claims and the accompanying drawings.

DETAILED DESCRIPTION

Figure 1:
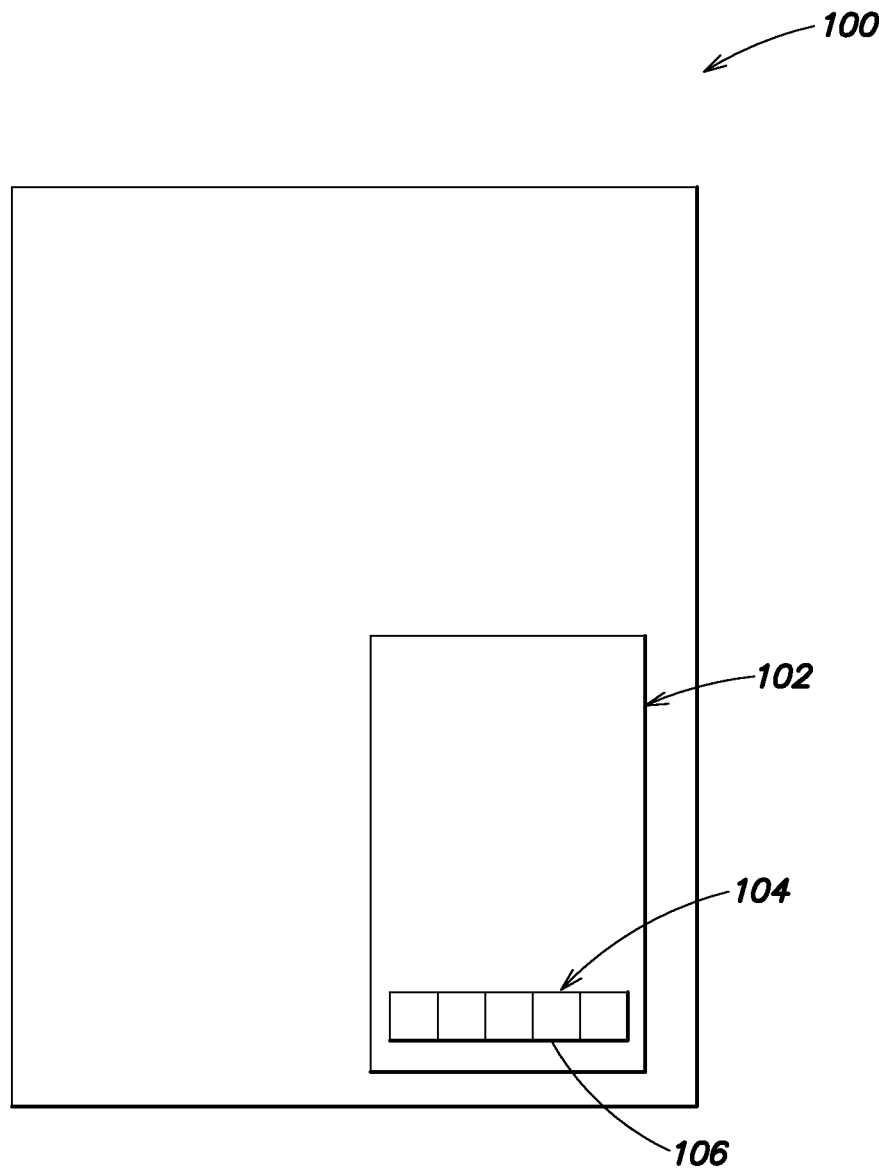
FIG. 1 is a schematic representation of an electronic device according to an embodiment of the present invention.

Reference will now be made in detail to embodiments of the present invention, examples of which are illustrated in the accompanying drawings, wherein like reference numerals refer to the like elements throughout. The embodiments are described below to explain the present invention by referring to the figures.

As used herein, the terms "a," "an" and "the" may refer to one or more than one of an item. The terms "and" and "or" may be used in the conjunctive or disjunctive and will generally be understood to be equivalent to "and/or." For brevity and clarity, a particular quantity of an item may be described or shown while the actual quantity of the item may differ.

Initially, it should be noted that the term voltage should be broadly interpreted to include the phrase "programming energy."

In accordance with an embodiment of the present invention, voltages of both a bit line and a word line may be adjusted to program a memory cell. Voltages of the bit line and the word line may initially be at standby voltages. Voltages of a word line may switch between a first voltage and a second voltage. The first voltage (e.g., 3 volts) may be high enough relative to the voltage applied to the bit line (e.g., 8 volts), that a net voltage (e.g., 5 volts) may result that may be less than a voltage that may program the memory cell. That is, the first voltage may result in a safe voltage. Using the voltage of the word line to adjust the net voltage to be less than a voltage that may program the memory cell is counter-intuitive in that conventionally the voltage of the bit line is used to control the net voltage. The second voltage (e.g., 0 volts) may be low enough relative to the voltage applied to the bit line (e.g., 8 volts), that a net voltage (e.g., 8 volts) may result that is effective to program the memory cell (i.e., a programming voltage). Thus, by switching from the safe voltage to the programming voltage (e.g., instead of switching from the standby voltage to the programming voltage), a much smaller voltage change may be used during programming that does not require the current to be limited.

FIG. 1 is a schematic representation of an electronic device 100 according to an embodiment of the present invention. The electronic device 100 may include an integrated circuit 102. The integrated circuit 102 may include a memory array 104. The memory array 104 may include a memory cell 106. The memory cell 106 is shown as part of the memory array 104 which is shown as part of the integrated circuit 102 which is shown as part of the electronic device 100. However, the electronic device 100 may otherwise access memory cells 106.

The electronic device 100 may include any of a variety of known or later-developed electronic devices that include or access memory cells 106. For example and not by way of limitation, the electronic device 100 may include a flash drive, a digital audio player, or a portable computer.

Figure 2A:
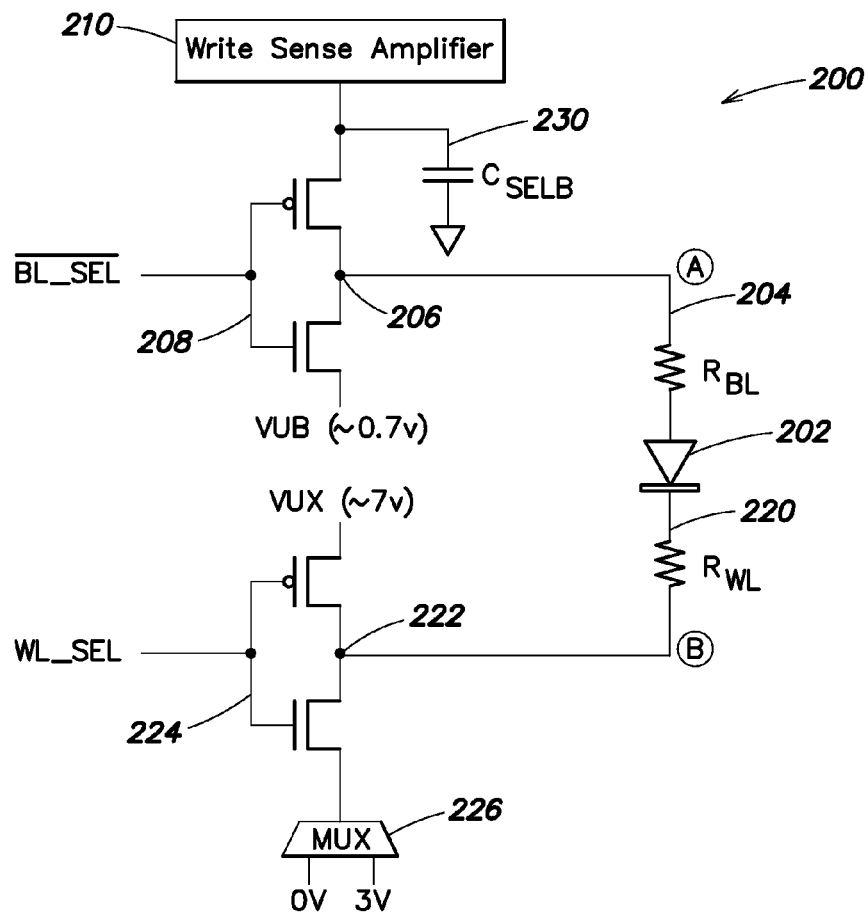
FIG. 2A is a schematic representation of a memory array, such as the memory array of FIG. 1.

FIG. 2A is a schematic representation of a memory array 200, such as the memory array 104 of FIG. 1. The memory array 200 may include a memory cell 202, a bit line 204, a bit line driver 206, a bit line select 208, a sense amplifier 210, a word line 220, a word line driver 222, a word line select 224, a control circuit 226, and a capacitor 230.

The memory cell 202 may be formed of any of a variety of known or later-developed materials. For example and not by way of limitation, the memory cell 202 may be formed of chalcogenide/PVM or chalcogenide-type materials. The memory cell 202 may be a two-terminal memory cell. The memory cell 202 may include an isolation unit. The isolation unit may include a diode including an anode and a cathode. The anode side may be sensed. The cathode side may be controlled. Alternatively, the anode side may be controlled, and the cathode side may be sensed.

The memory cell 202 may be connected to the bit line 204. The bit line 204 may be coupled to a terminal on the anode side of the memory cell 202. That is, the bit line may be on the sensed side. The bit line 204 may be long relative to the word line 220. The bit line 204 may be connected to the bit line driver 206. The bit line driver 206 may be controlled by the bit line select 208. When the bit line select 208 is enabled, it may connect the bit line 204 to the sense amplifier 210. The bit line driver 206 may be enabled or disabled based on a charge of the capacitor 230.

The memory cell 202 may be connected to the word line 220. The word line 220 may be coupled to a terminal on the cathode side of the memory cell 202. That is, the word line may be on the side that is controlled. The word line 220 may be connected to the word line driver 222. The word line driver 222 may be controlled by the word line select 224. When the word line select 224 is enabled, it may connect the word line 220 to the control circuit 226. The word line 220 may be shorted together with another word line so that word lines are shared.

The sense amplifier 210 may be a write sense amplifier. As will be described further below, the sense amplifier 210 may control programming of the memory cell 202 in conjunction with the control circuit 226.

The control circuit 226 may include a dedicated regulator (e.g., a MUX). The control circuit 226 may control the amount of voltage applied to the word line 220. The control circuit 226 may switch between two voltages.

It should be noted that the word line and the bit line may be switched between more than two voltages, such as from standby voltages to, for example, a first voltage and to a second voltage. Examples of standby voltages are described in U.S. Pat. Nos. 6,822,903 and 6,963,504, both to Scheuerlein and Knall, and both entitled "APPARATUS AND METHOD FOR DISTURB-FREE PROGRAMMING OF PASSIVE ELEMENT MEMORY CELLS," both of which are incorporated by reference herein in their entirety for all purposes. In these examples, first and second array lines may be driven to selected bias voltages. Then, the first and second array lines may be driven to unselected bias voltages. The timing of when the first and second array lines may be driven to selected bias voltages and when the first and second array lines may be driven to unselected bias voltages may be adjusted relative to one another (i.e., the first array line relative to the second array line), for example, to prevent unintended programming of cells located near target cells in an array. It should be appreciated that in the present disclosure, such standby voltages should not be confused with the first voltage (i.e., as discussed below, the voltage that, when coupled with the voltage applied to the bit line, results in a safe voltage).

The first voltage (e.g., 3 volts) may be high enough that when coupled with voltage applied to the bit line 204 (e.g., 8 volts), may result in a net voltage (e.g., 5 volts) that may be less than a voltage that may program the memory cell 202. That is, the first voltage may result in a safe voltage. The second voltage (e.g., 0 volts) may be low enough that when coupled with voltage applied to the bit line 204 (e.g., 8 volts), may result in a net voltage (e.g., 8 volts) effective to program the memory cell 202. That is, the second voltage may result in a programming voltage.

Alternatively, the control circuit 226 may include a diode connected NMOS device and a bypass path. The diode connected NMOS device may generate the first voltage (i.e., the safe voltage). The bypass path, when selected, may generate the second voltage (resulting in the programming voltage).

The actual value of the first and second voltages may be determined based upon multiple considerations. One consideration may be that the difference between the two voltages should be sufficient to distinguish between programming and not programming. Another consideration may be that the smaller the difference between the two voltages is, the faster the programming of the memory cell 202 may be.

Figure 2B:
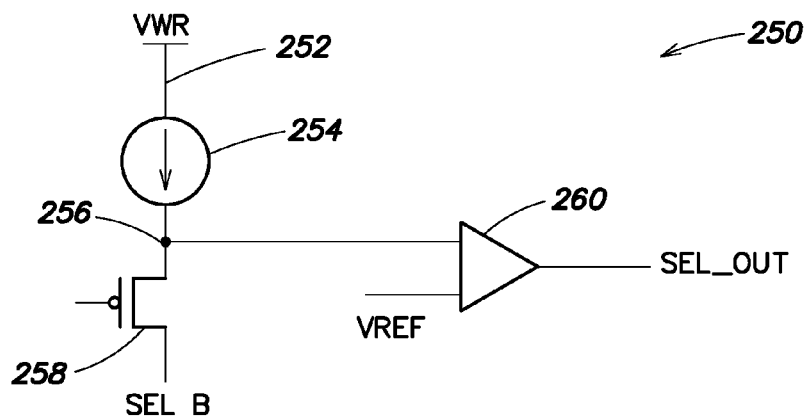
FIG. 2B is a schematic representation of a sense amplifier, such as the sense amplifier of FIG. 2A.

FIG. 2B is a schematic representation of a sense amplifier 250, such as the sense amplifier 210 of FIG. 2A. The sense amplifier 250 may be a write sense amplifier. The sense amplifier 250 may control programming of the memory cell 202 in conjunction with the control circuit 226. The sense amplifier 250 may include a voltage 252, a current limiter 254, a node 256, a pMOS 258, and a voltage reference 260.

The voltage 252 may flow through the current limiter 254, the node 256, and the pMOS 258. The current limit may limit to a predetermined amount (e.g., 1 microamp). The voltage 252 may be compared with the voltage reference 260. Once the memory cell 202 programs, the voltage 252 flowing through the node 256 may fall.

Figure 3:
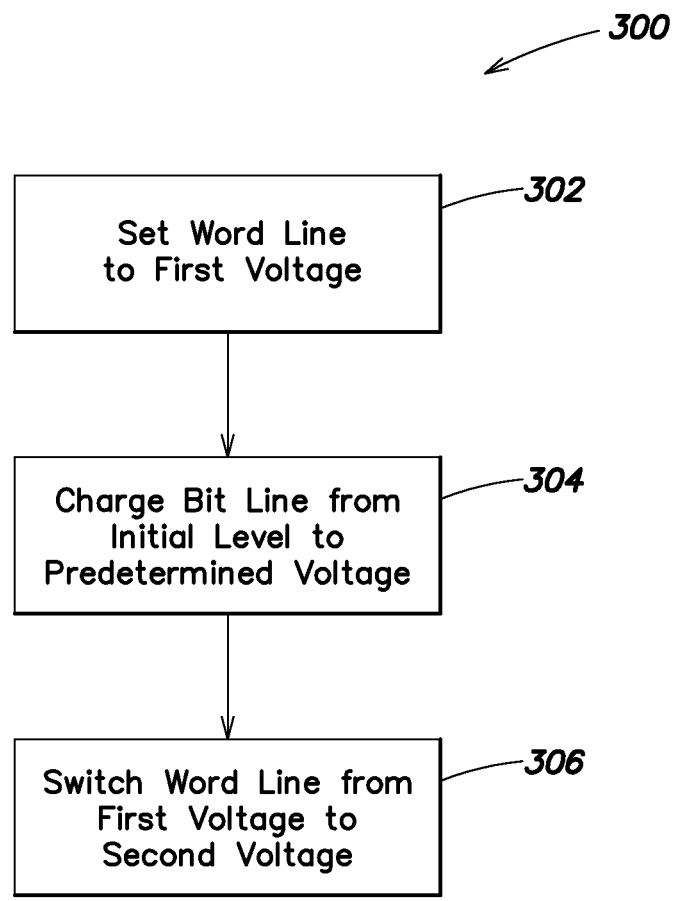
FIG. 3 is a flowchart of an exemplary method of programming a memory cell according to an embodiment of the present invention.
Figure 4:
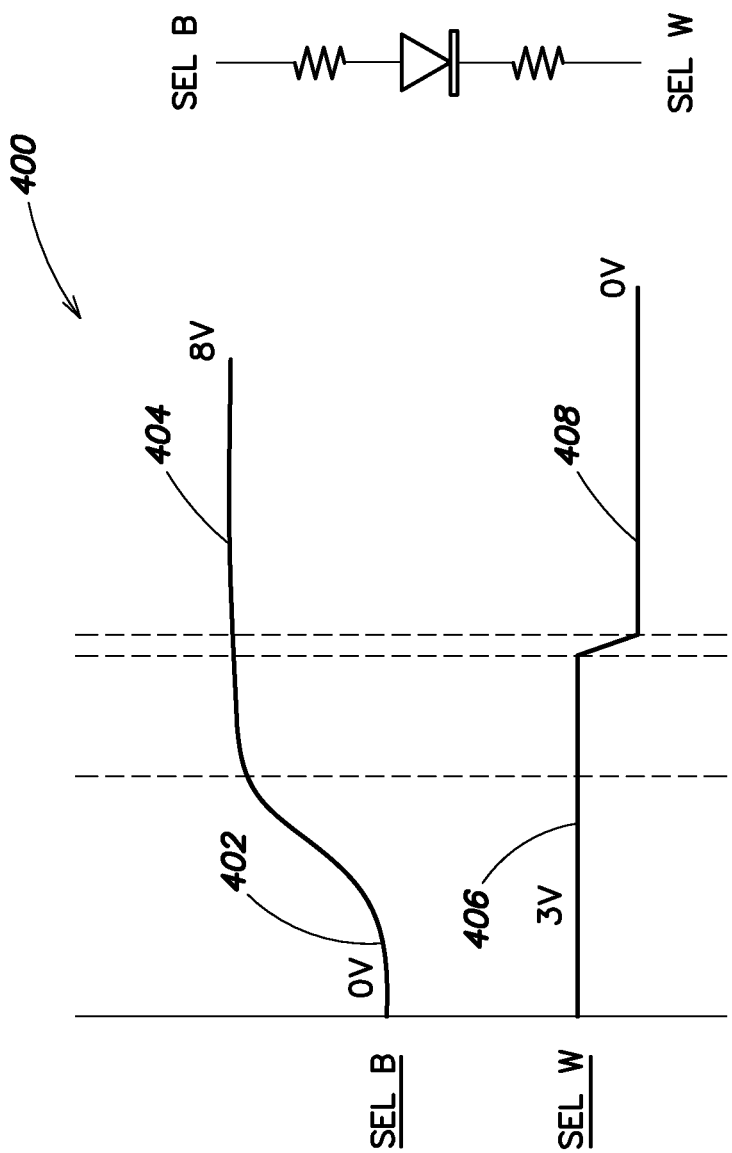
FIG. 4 is a schematic representation of voltages of a bit line and a word line according to an embodiment of the present invention.

The operation of the memory array 200 is now described with reference to FIGS. 3 and 4, which illustrate, respectively, an exemplary method 300 of programming a memory cell 202, and voltages 400 of a bit line 204 and a word line 220.

In operation 302, the word line 220 may be set to a first voltage 406. For example and not by limitation, the voltage of the word line 220 may be set to 3 volts. The word line select 224 may be enabled thereby connecting the word line 220 through the word line driver 222 to the control circuit 226.

In operation 304, the bit line 204 may be charged from an initial level 402 to a predetermined voltage 404. For example and not by limitation, the bit line 204 may be charged from an initial level of 0 volts to a predetermined voltage of 8 volts. The bit line 204 may be charged from the initial level 402 to the predetermined voltage 404 quickly and without limitation. The bit line select 208 may be enabled thereby connecting the bit line 204 through the bit line driver 206 to the sense amplifier 210.

The first voltage 406 of the word line (e.g., 3 volts) may be high enough that relative to the predetermined voltage 404 of the bit line 204 (e.g., 8 volts), a net voltage difference results (e.g., 5 volts) that may be less than a voltage needed to program the memory cell 202. That is, the first voltage 406 may result in a safe voltage.

In operation 306, the word line 220 may be switched from the first voltage 406 to a second voltage 408. The second voltage (e.g., 0 volts) may be low enough that relative to the predetermined voltage 404 applied to the bit line 204 (e.g., 8 volts), a net voltage difference (e.g., 8 volts) may result that is effective to program the memory cell 202. That is, the second voltage 408 may result in a programming voltage. The control circuit 226 may switch between the first voltage 406 and the second voltage 408.

As noted above, the bit line 204 may be long relative to the word line 220. Thus, the switching of the word line 220 may be faster than if the bit line were switched or otherwise controlled.

The foregoing description discloses only exemplary embodiments of the invention. Modifications of the above-disclosed embodiments of the present invention of which fall within the scope of the invention will be readily apparent to those of ordinary skill in the art.

Accordingly, while the present invention has been disclosed in connection with exemplary embodiments thereof, it should be understood that other embodiments may fall within the spirit and scope of the invention as defined by the following claims.

The invention claimed is:

1. A method of programming a selected memory cell, the method comprising:
    setting a word line of the selected memory cell to a first voltage; setting a bit line of the selected memory cell to a predetermined voltage wherein a voltage difference between the first voltage and the predetermined voltage is a voltage that does not program the selected memory cell; and
    reducing the word line from the first voltage to a second voltage,
    wherein the voltage difference between the second voltage and the predetermined voltage is a programming voltage that is sufficient to program the selected memory cell.

2. The method of claim 1, wherein a difference between the voltage that does not program the selected memory cell and the programming voltage is selected to maximize programming speed.

3. The method of claim 1, wherein a difference between the voltage that does not program the selected memory cell and the programming voltage is selected to distinguish between programming and not programming the selected memory cell.

4. The method of claim 1, wherein the bit line is set to the predetermined voltage without limiting current.

5. The method of claim 1, wherein the first voltage is higher than the second voltage.

6. The method of claim 1, wherein switching the word line from the first voltage to the second voltage includes a VT drop.

7. An apparatus comprising:
    a control circuit coupled to a word line of a memory cell; and
    a sense amplifier coupled to a bit line of the memory cell;
    wherein the control circuit is adapted to switch the word line from a first standby voltage to a first voltage, the sense amplifier is adapted to charge the bit line from a second standby voltage to a predetermined voltage, and a first voltage difference between the word line at the first voltage and the bit line at the predetermined voltage is a safe voltage that does not program a memory cell, and
    wherein the control circuit is further adapted to switch the word line from the first voltage to a second voltage, and a second voltage difference between the word line at the second voltage and the bit line at the predetermined voltage is a programming voltage that is sufficient to program the selected memory cell.

8. The apparatus of claim 7, wherein the control circuit includes a MUX or a diode-connected NMOS transistor.

9. The apparatus of claim 7, wherein a difference between the safe voltage and the programming voltage is selected to maximize programming speed.

10. The apparatus of claim 7, wherein a difference between the safe voltage and the programming voltage is selected to distinguish between programming and not programming the selected memory cell.

11. The apparatus of claim 7, wherein the bit line is switched to the predetermined voltage without limiting current.

12. The apparatus of claim 7, wherein the first voltage is higher than the second voltage.

13. The apparatus of claim 7, wherein switching the word line from the first voltage to the second voltage includes a VT drop.

14. A memory array comprising:
    a control circuit coupled to a word line of a memory cell; and
    a sense amplifier coupled to a bit line of the memory cell;
    wherein the control circuit is adapted to switch the word line from a first standby voltage to a first voltage, the sense amplifier is adapted to charge the bit line from a second standby voltage to a predetermined voltage, and a first voltage difference between the word line at the first voltage and the bit line at the predetermined voltage is a safe voltage that does not program a memory cell, and
    wherein the control circuit is further adapted to switch the word line from the first voltage to a second voltage, and a second voltage difference between the word line at the second voltage and the bit line at the predetermined voltage is a programming voltage that is sufficient to program the selected memory cell.

15. The memory array of claim 14, wherein the control circuit includes a MUX or a diode-connected NMOS transistor.

16. The memory array of claim 14, wherein a difference between the safe voltage and the programming voltage is selected to maximize programming speed.

17. The memory array of claim 14, wherein a difference between the safe voltage and the programming voltage is selected to distinguish between programming and not programming the selected memory cell.

18. The memory array of claim 14, wherein the bit line is switched to the predetermined voltage without limiting current.

19. The memory array of claim 14, wherein the first voltage is higher than the second voltage.

20. The memory array of claim 14, wherein switching the word line from the first voltage to the second voltage includes a VT drop.

* * * * *